United States Patent [19]

Breske et al.

[11] Patent Number: 4,518,110
[45] Date of Patent: May 21, 1985

[54] DEVICE FOR SOLDERING/DESOLDERING APERTURED LENDLESS PACKAGES

[75] Inventors: Carl D. Breske, Scandia; Jeffrey M. Borning, Ham Lake, both of Minn.

[73] Assignee: Control Data Corporation, Minneapolis, Minn.

[21] Appl. No.: 421,604

[22] Filed: Sep. 22, 1982

[51] Int. Cl.³ .............................. B23K 3/02
[52] U.S. Cl. .......................... 228/20; 228/19; 228/51; 219/230
[58] Field of Search .......... 228/51, 47, 191, 19, 228/20, 119, 264; 219/85 R, 85 D, 228, 230

[56] References Cited

U.S. PATENT DOCUMENTS

| 2,293,455 | 9/1941 | Disch et al. | 219/26 |
| 3,050,612 | 8/1962 | Eversole | 219/26 |
| 3,407,985 | 10/1968 | Miller | 228/51 |
| 3,552,630 | 1/1971 | Dean | 228/46 |
| 3,576,969 | 5/1971 | Surty | 219/221 |
| 3,582,610 | 1/1971 | Eckles | 219/209 |
| 3,632,036 | 1/1972 | Halstead | 228/54 |
| 3,632,973 | 1/1972 | O'Keefe | 219/230 |
| 3,649,809 | 3/1972 | Halstead | 219/228 |
| 3,746,239 | 7/1973 | Auray | 228/19 |
| 3,766,623 | 10/1973 | Lerner et al. | 29/203 B |
| 3,990,863 | 11/1976 | Palmer | 29/203 |
| 4,066,204 | 1/1978 | Wirbser et al. | 228/264 |
| 4,136,444 | 1/1979 | Durney | 29/764 |
| 4,274,576 | 6/1981 | Shariff | 228/264 |

FOREIGN PATENT DOCUMENTS

| 1157432 | 7/1969 | United Kingdom . |
| 1376098 | 12/1974 | United Kingdom . |
| 1391079 | 4/1975 | United Kingdom . |
| 1427392 | 3/1976 | United Kingdom . |
| 2041808 | 9/1980 | United Kingdom . |

OTHER PUBLICATIONS

Scrupski, "Part One-Plastic-Ceramic LSI Package Design Concepts", *Electronics*, Apr. 12, 1971, pp. 75-86.

*Primary Examiner*—Kenneth J. Ramsey
*Attorney, Agent, or Firm*—Edmund J. Wasp; Joseph A. Genovese

[57] ABSTRACT

A solder/desolder tool has a heater block supporting a handle at its upper end and a heating plate at its lower end. The heating plate is thermally engaged by heating elements housed in the heater block. An array of pin relief apertures are formed in the heating plate. Retractable clamps are pivoted to the heater block for clamping a leadless chip against the heating plate. The leadless chip has an array of input/output sockets corresponding to the array of pin relief apertures. A method is disclosed for soldering the chip sockets to a corresponding array of pins supported by a PC board. According to the method, solder balls are loaded in the chip sockets, and the chip is then secured in the tool to reflow the solder balls to form solder plugs. The solder plugs are then set upon the upper ends of the pins and melted by the heating plate so that solder joints are formed between the pins and sockets. The chip is released from the tool to allow the solder joints to cool. A desoldering method is disclosed wherein the tool is secured to a chip which is in a soldered condition (i.e., the chip sockets are soldered to the pins). The heating plate applies heat to the solder joints about the individual circumferences of the pins. Once the solder joints reach reflow temperature, the chip can be removed from the pins.

5 Claims, 10 Drawing Figures

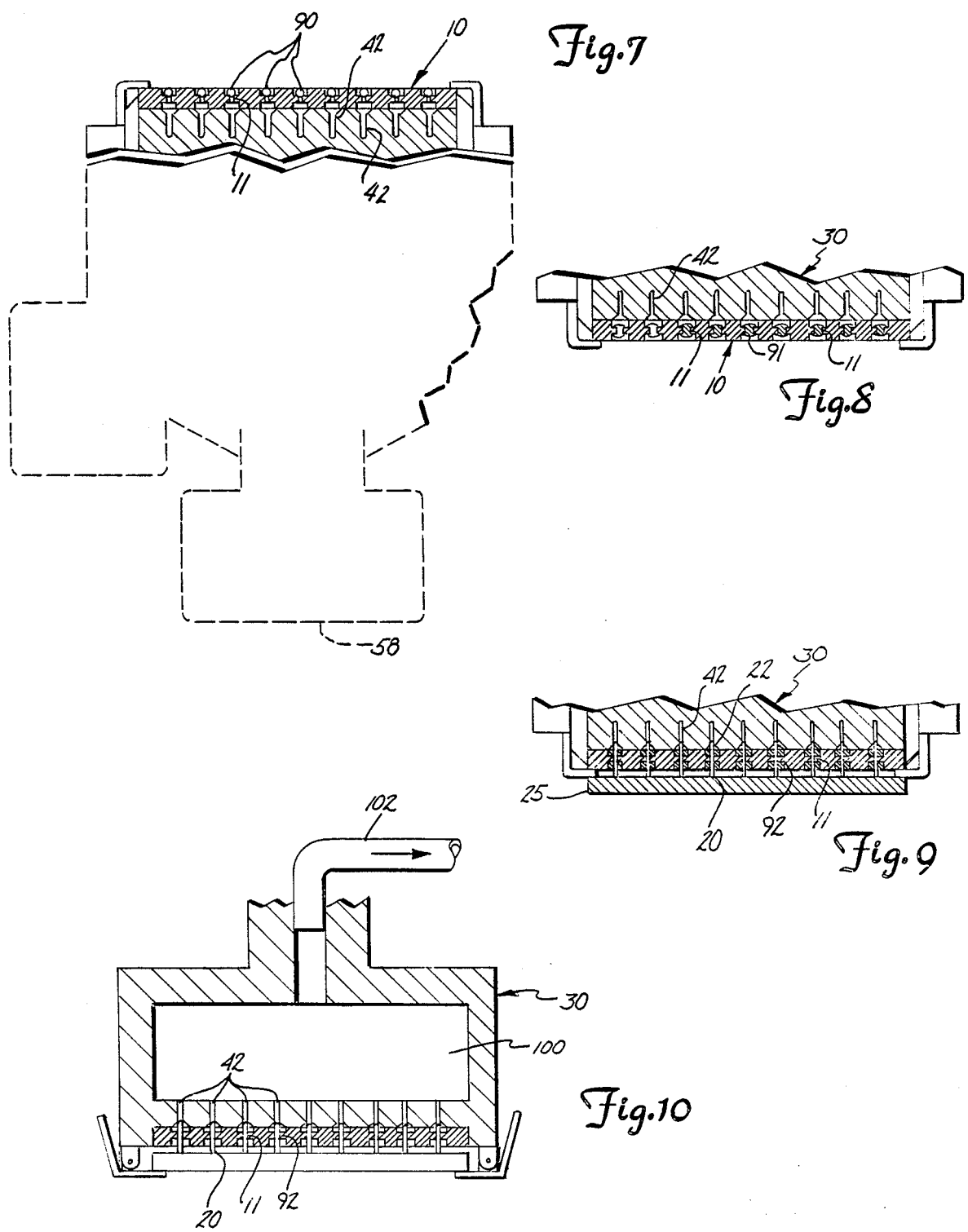

DEVICE FOR SOLDERING/DESOLDERING APERTURED LENDLESS PACKAGES

BACKGROUND OF THE INVENTION

The present invention relates to soldering and desoldering tools and methods.

Various tools and techniques have been developed to attempt to quickly and easily desolder chips and components from circuit boards. Examples of these devices are shown in U.S. Pat. Nos. 4,274,576; 4,136,444; 4,066,204; 3,990,863; 3,766,623; 3,649,809; 3,746,239; 3,632,973; 3,643,036; 3,582,610; 3,576,969; 3,552,630; 3,050,612; 3,407,985; and 2,293,455.

A review of these patents indicates that the bulk of the prior teachings go to desoldering DIP chips. For example U.S. Pat. Nos. 3,632,073; 3,990,863; and 4,136,444 show desoldering methods for DIP chips wherein heat is directly applied to the DIP chip pins while an associated mechanism grasps the chip and extracts it from the board. U.S. Pat. Nos. 3,632,036; 3,746,239; 3,649,809; and 3,766,036 show tools for heating the pins of a DIP chip to melt the solder joints. U.S. Pat. Nos. 3,746,239; 3,649,809; and 3,766,623; on the other hand, show tools for heating the DIP solder joints directly at the circuit board.

None of the prior art devices disclose or suggest a tool or method for desoldering a leadless type chip. A "leadless chip" is a chip having input/output sockets rather than input/output pins. Such a chip is believed to have been first disclosed in the commonly assigned copending patent application of Warren B. Marquardt, Ser. No. 396,539, filing date July 8, 1982, now abandoned, entitled "Improved Chip/Circuit Board Interface Structure and Method."

It is characteristic of leadless chips to have a "high pin count." That is, a high number of pin/socket solder connections per chip. Typically in excess of 100 such solder connections are required to solder a leadless chip to a corresponding array of pins. The need for desoldering tools for high pin count chips is especially great.

There is apparently relatively little prior art showing soldering, as opposed to desoldering, tools and methods. U.S. Pat. No. 3,576,969 shows one tool for soldering a multilead chip. The tool would be unsuitable, however, for a leadless-type chip.

There is consequently a need for quick, simple and safe soldering as well as desoldering tools and methods for leadless chips.

SUMMARY OF THE INVENTION

The present invention fills the need for quick and simple solder/desolder tools and methods for leadless chips by providing a solder/desolder hand tool which clamps onto a leadless chip to solder it to a corresponding pin array, or to desolder it from the pin array. Solder/desolder methods which can be practiced using the tool are disclosed. An alternate embodiment is disclosed which removes the solder as it melts during desoldering.

It is, therefore, an object of the present invention to provide an improved solder/desolder tool and improved solder/desolder methods for leadless chips.

Another object is to provide a solder/desolder tool which can simultaneously solder or desolder all of the solder connections of a high pin count leadless chip.

Another object is to provide a tool for conveniently handling a leadless chip while it is being soldered or disoldered.

Yet another object is to provide a tool which applies heat for soldering or desoldering directly to the top of a leadless chip.

These and other objects, advantages and novel features of the invention will become apparent from the following detailed description of the invention taken in conjunction with the accompanying drawings.

BRIEF DESCRIPTION OF THE DRAWINGS

FIG. 7 shows a cross-sectional view of the leadless chip secured to the tool and preloaded with solder balls.

FIG. 8 shows the leadless chip secured to the tool after the solder balls have been reflowed to form solder plugs in the sockets.

FIG. 9 is a cross-sectional view showing solder joints formed between the solder plugs of the leadless chip and the pins of the pin array.

FIG. 10 shows a cross-sectional elevational view of an alternate embodiment of the invention.

DESCRIPTION OF THE PREFERRED EMBODIMENT

The present invention comprises both a tool and method for soldering a leadless chip 10 to the pins 20 of a PC board 25, and for desoldering the chip 10 from the pins 20 of board 25.

Before describing the tool itself, the leadless type chip with which the tool is employed will be generally described.

Figure 1:
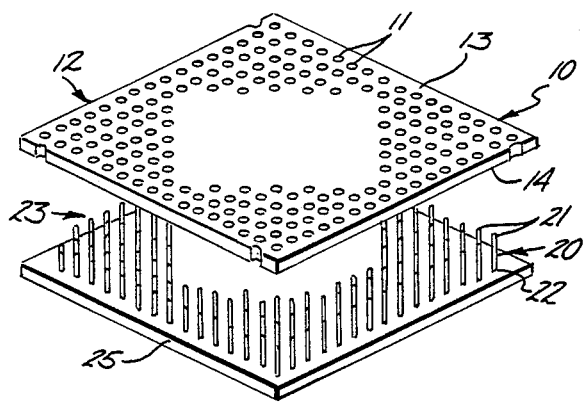
FIG. 1 is a perspective view of a leadless chip.
Figure 2:
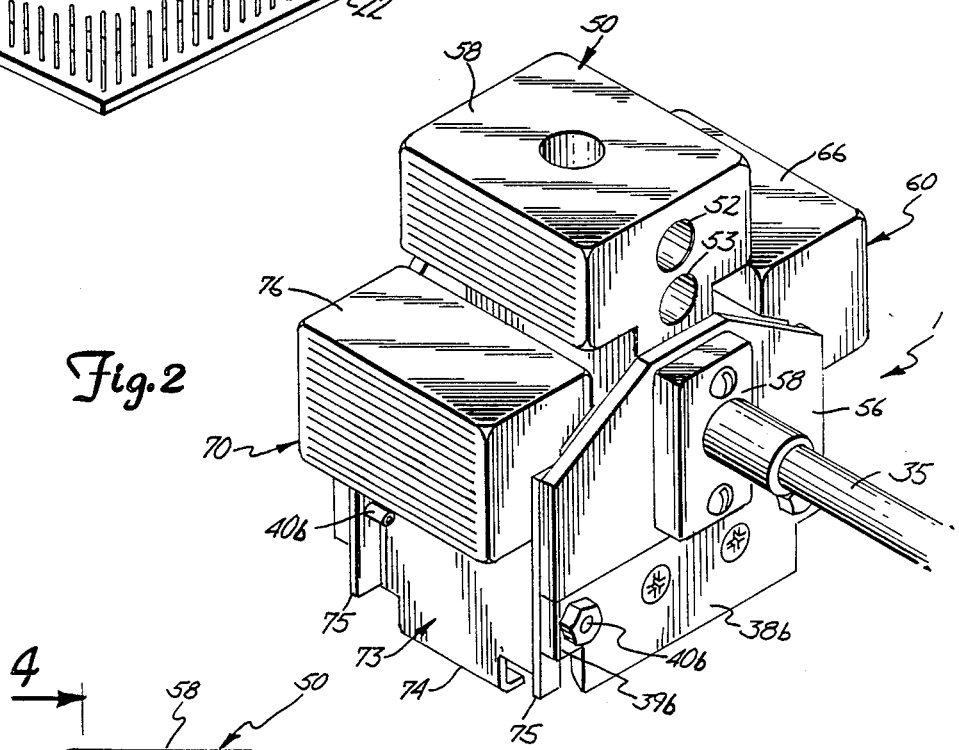
FIG. 2 is a perspective view of the tool of the present invention.
Figure 3:
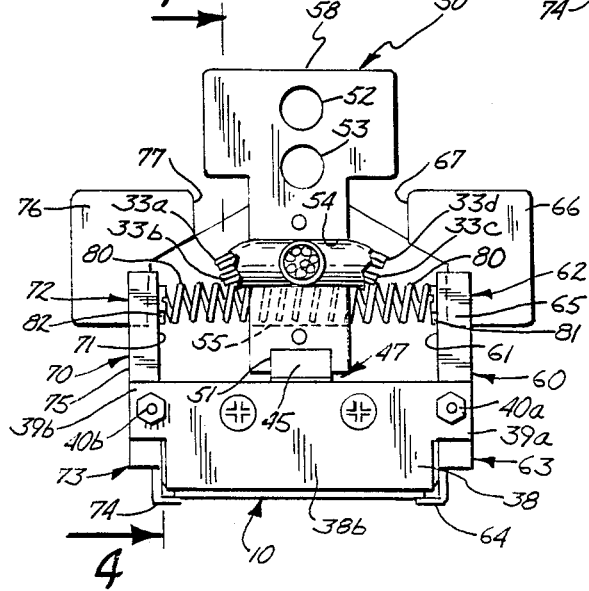
FIG. 3 shows an elevational view of the invention with side plate 56 removed.
Figure 4:
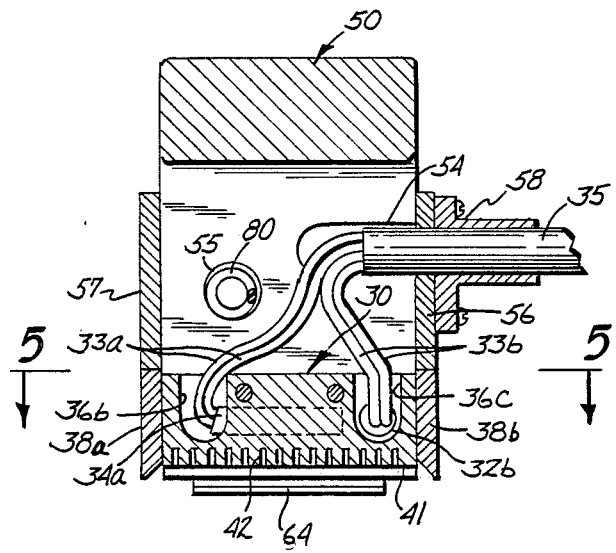
FIG. 4 shows a cross-sectional elevational view taken along line 4—4 of FIG. 3.
Figure 5:
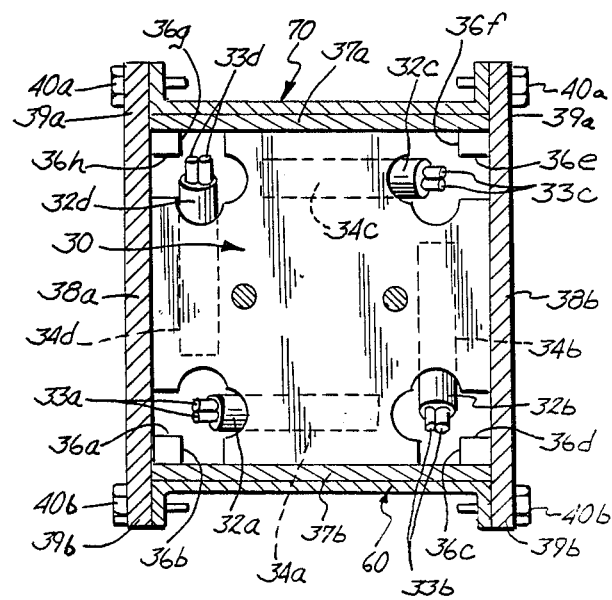
FIG. 5 shows a cross-sectional plan view taken along line 5—5 of FIG. 4.

As shown in FIG. 1, chip 10 is "leadless" in that it has input/output sockets 11 rather than permanently attached input/output pins. As mentioned hereinbefore, the leadless chips 10 is first believed to have been disclosed in the commonly assigned copending application of Warren B. Marquardt, Ser. No. 396,539, filed July 8, 1982, entitled "Improved Chip/Circuit Board Interface Structure and Method."

The sockets 11 of chip 10 are disposed in a socket array 12 as shown in FIG. 1. Chip 10 has a top 13 and a bottom 14. Leadless chips must be soldered to an array of pins which correspond to their socket array. The pin array is generally supported by a circuit board as shown in FIG. 1, where the lower ends 22 of pins 20 are supported by board 25. The upper ends 21 of pin array 23 align with the sockets 11 of socket array 12.

The solder/desolder tool 1 of the present invention and associated methods provide a simple and easy means for soldering the leadless chip 10 to the pin array 23 and for desoldering the chip 10 from the array 23.

Figure 6:
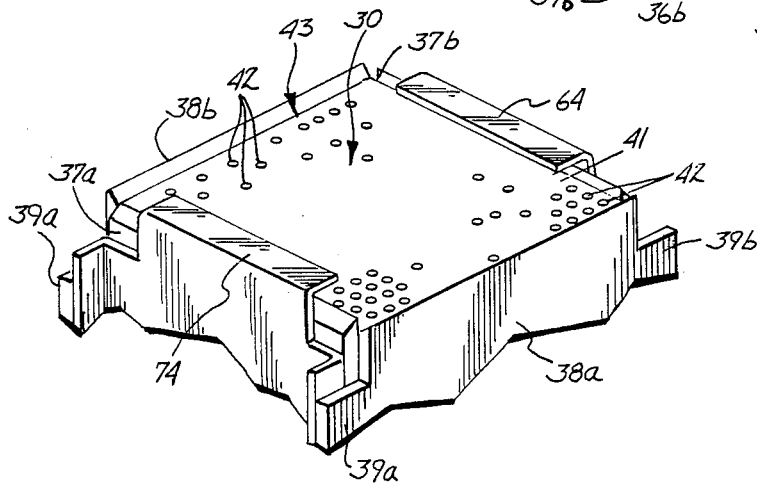
FIG. 6 shows a perspective view of the bottom of the tool of the present invention with the chip 10 removed.

The solder/desolder tool 1 of the present invention is best shown in FIGS. 2 through 6. Tool 1 generally comprises a heater member, or block, 30, fixed handle 50, and opposed clamps 60 and 70. Heater block 30 houses four cylindrical electrical resistance heating elements 32a, 32b, 32c and 32d in a box configuration best shown in FIG. 5. Each of the heating elements 32a through 32d is slideably received in a cylindrical cavity 34a through 34d formed into the generally solid heater block 30. Access slots 36a through 36h are also formed into block 30 as shown. The slots 36a–36h permit the elements 32a through 32d to be inserted into or withdrawn from the respective cavities 34a through 34d. Each element 32a through 32d has a pair of electrical conductors 33a through 33d, respectively, which supply the electrical current necessary to heat the elements 32a through 32d. The four pairs of conductors 33a through 33d are collected in a recess 54 formed in the handle 50, and are then consolidated in a conduit 35 which leads to a temperature control module (not shown). A pair of retainer plates 37a, 37b are secured on opposite sides of the block 30 by suitable means such as screws so that they are removable. A pair of retainer/pivot plates 38a, 38b are secured to the opposite pair of sides of the block 30 as shown. Plates 37a, 37b, 38a, 38b together seal the slots 36a through 36h and securely retain the elements 32a through 32d in block 30. Each of the retainer/pivot plates 38a, 38b includes a pair of pivot projections 39a, 39b which carry pivot pins 40a, 40b, respectively. The bottom surface 41 of heater block 30 is the heating plate of the tool 1. The plate 41 is heated by elements 32a through 32d. As shown in FIG. 6, heating plate 41 has a plurality of pin relief apertures 42 formed in an array 43. Array 43 corresponds to the socket array 12 and pin array 23. Of course, inasmuch as leadless chips have various different socket arrays, the aperture array of the heater block 30 would correspond to the socket array of the particular chip with which it is employed.

A thermal insulator bar 45 is secured to the top surface of heater block 30 by screws 46 (not shown). An air space 47 is provided between bar 45 and block 30 to reduce heat flow from block 30 to bar 45.

Fixed handle 50 is T-shaped and has a notch 51 at its lower end. Insulator bar 45 is secured to handle 50 in notch 51 by some suitable means such as screws. A pair of cooling holes 52, 53 are formed through handle 50 to dissipate heat. A recess 54 is formed into the front side of the handle 50 to carry and distribute the wires 33a through 33d for the heating elements 32a through 32d as before described. A cylindrical cavity 55 is formed transversly through the handle 50 to accommodate and retain the clamping spring 80 (later described). A pair of side plates 56, 57 are suitably secured on opposite sides of handle 50. Side plate 56 carries a fitting 58 for electrical conduit 35.

A pair of oppositely disposed clamps 60 and 70 are pivoted to the pivot pins 40a, 40b through suitable apertures (not shown) in side flanges 65, 75, respectively, of the clamps 60, 70. Clamp 60 has a spring bearing surface 61 and clamp 70 has a spring bearing surface 71. Clamping spring 80 is secured at end 81 to spring bearing surface 61 and at end 82 to spring bearing surface 71. The spring 80 is in compression and biases the upper portions 62, 72, respectively, of clamps 60, 70 outwardly, and biases the lower portions 63, 73, respectively, of clamps 60, 70 inwardly. The lower portions 63, 73 of clamps 60, 70 include respective inwardly disposed jaw portions 64, 74. Spring 80 biases jaws 64, 74 inwardly to securely clamp chip 10 against heating plate 41 as will be later described more fully. The upper portions 62, 72 of clamps 60, 70 carry respective handle members 66, 76. Handle member 66, 76 are suitably secured to the clamps 60, 70 by screws (not shown) or other suitable means. Handle members 66, 76 have respective inwardly disposed faces 67, 77. The faces 67, 77 comprise respective stops for the clamps 60, 70 limiting the inward travel of the handles 66, 77, towards fixed handle 50, and simultaneously, the outward travel of the jaws 64, 74 when the spring 80 is compressed by clamps 60, 70.

Having disclosed the basic structure of the preferred embodiment of the instant solder/desolder tool 1, the soldering and desoldering methods of the present invention as practiced by means of the inventive tool 1 will now be described.

To begin the procedure for soldering a leadless chip 10 to the pins 20 of a circuit board 24, each of the sockets 11 of the chip 10 is preloaded with a solder ball 90. Tool 1 is inverted to stand on the flat top 58 of handle 50. Clamp handles 66, 76 are forced inwardly to retract the jaws 64, 74 against the force of spring 80. With the jaws 64, 74 in the retracted position, the preloaded chip 10 is set upon the heating plate 41 and clamps 60, 70 are released to secure the chip 10 in tool 1. See FIG. 7. Heating elements 32a–32d are then energized via the temperature control module (not shown) to heat the solder balls 90 to their reflow temperature at which point the balls 90 reflow to form solder plugs 91 in the sockets 11. See FIG. 8. The chip 10 is then removed from tool 1 to cool. Alternatively, the solder plugs 91 can be formed by the vapor phase reflow, or other method, before the chip 10 is secured to tool 1. Regardless of the method employed, the cold chip, with solder plugs 91 formed in sockets 11, is clamped to the tool 1 and the plugs 91 are set upon the upper ends 21 of the pin array 23. The elements 32a–32d are energized by the temperature control module to heat the plugs 91 to their reflow temperature. At the reflow temperature characteristic to the solder alloy used, the plugs 91 settle down upon the pins 20 to form solder joints 92, and the chip 10 is released from tool 1 to allow the joints 92 to cool. The chip 10 is now in its soldered condition. See FIG. 9. Note that a pin relief aperture 42 aligns with each socket 12 and pin 20 so that the upper ends 21 of the pins 20 are free to pass upward into the apertures 42 if necessary. According to the above method, therefore, all of the solder joints of a high pin count leadless chip 10 can be simultaneously formed.

To desolder the chip 1 from the pins 20, the tool 1 is secured to the chip 10 by retracting the jaws 64, 74 and then releasing them to clamp the chip 10 against the heating plate 41. The upper ends 21 of pins 20 can be accommodated in pin relief apertures 42 if necessary. With the chip 10 in this secured position in tool 1, and being in its soldered condition, the lower ends of pin relief apertures 42 surround each of the solder joints 92. The heating elements 32a–32d are energized via the temperature control module to heat the solder joints 92 to their reflow temperature. A thermocouple (not shown), suitably secured to block 30, senses the temperature of heater block 30 and is operatively associated with a temperature readout in the temperature control module. The operator watches the temperature readout to insure that the reflow temperature has been reached before attempting to remove the chip 10 from the pin array 23. Accordingly, by the use of the tool 1 all of the solder joints 92 of a leadless chip 10 can be simultaneously desoldered as well as simultaneously soldered.

FIG. 10 shows an alternate embodiment of the invention wherein a suction chamber 100 is provided directly above and in fluid comunication with the pin relief apertures 42. A suction conduit 102 is fluidly connected to the top of the suction chamber 100 and leads to a suction pump (not shown). According to this alternate embodiment of the invention, the suction pump is activated during the desoldering operation to draw the melted solder up into suction chamber 100 through the apertures 42. The melted solder is then removed from the tool via conduit 102. Hence, this structural embodiment of the invention and method not only simultaneously desolders all of the solder joints of a high pin count leadless chip, but in addition, removes the liquified solder as it melts.

Having disclosed the preferred embodiment of the structure and methods of the present invention, many modifications and variations thereof would be obvious to those skilled in the art, and the invention is, accordingly, intended to be limited only by the scope of the appended claims.

What is claimed is:

1. A tool for soldering and for desoldering a chip to a circuit board; said chip having an array of sockets extended through it from a bottom surface to a top surface thereof, and said circuit board including at least one array of pins mounted to said board and extended away therefrom, whereby the end of each pin remote from said circuit board extends into one of said sockets whenever said chip is positioned for soldering to said circuit board; said tool comprising:

a heater member comprised of a flat heating plate heated by at least one heating element; means defining a plurality of pin relief apertures in said plate; means for removably mounting said chip to said heater member in a secured position wherein the top surface of said chip abuts said plate and each of said sockets is aligned with one of said pin relief apertures, whereby said apertures receive any of said pins extending through their associated sockets and beyond said top surface with said chip in said secured position and so positioned for soldering; and means defining a suction chamber disposed within said heater member adjacent said plate and in fluid communication with a suction means; said pin relief apertures providing fluid communication between said suction chamber and said chip, whereby as said heating plate melts solder joints to produce melted solder, said melted solder is drawn through said pin relief apertures into said suction chamber.

2. The solder/desolder tool of claim 1, wherein said securing means comprises a pair of oppositely disposed jaws which are moveable towards one another to grasp said chip and to secure the top surface of said chip against said heating plate in said secured position, said jaws being selectively retractable to release said chip.

3. The solder/desolder tool of claim 2 wherein each of said jaws is disposed from the lower portion of a clamp, each of said clamps being pivoted at a pivot point to said heater member, further comprising a means for biasing said jaws towards one another.

4. The solder/desolder tool claim 3 wherein each of said clamps has an upper portion above said pivot point, said lower portions being below said pivot point, said biasing means biasing said upper portions of said clamps away from one another and said lower portions of said clamps towards one another.

5. The solder/desolder tool of claim 4 further comprising a handle member secured to said heater member, said biasing means being supported by said handle member.

* * * * *